(12) United States Patent
Lee (10) Patent No.: US 12,532,774 B2
(45) Date of Patent: Jan. 20, 2026

(54) CONDUCTIVE ORGANIC MODULE FOR SEMICONDUCTOR DEVICES AND ASSOCIATED SYSTEMS AND METHODS

(71) Applicant: Micron Technology, Inc., Boise, ID (US)

(72) Inventor: Jungbae Lee, Taichung (TW)

(73) Assignee: Micron Technology, Inc., Boise, ID (US)

(*) Notice: Subject to any disclaimer, the term of this patent is extended or adjusted under 35 U.S.C. 154(b) by 269 days.

(21) Appl. No.: 17/592,029

(22) Filed: Feb. 3, 2022

(65) Prior Publication Data

US 2023/0069208 A1 Mar. 2, 2023

Related U.S. Application Data

(60) Provisional application No. 63/238,096, filed on Aug. 27, 2021.

(51) Int. Cl.
*H01L 25/065* (2023.01)
*H01L 25/00* (2006.01)

(52) U.S. Cl.
CPC .......... *H01L 25/0657* (2013.01); *H01L 25/50* (2013.01); *H01L 2225/06506* (2013.01);
(Continued)

(58) Field of Classification Search
CPC ................. H01L 25/0657; H01L 25/50; H01L 2225/06506; H01L 2225/06524; H01L 2225/06562; H10B 80/00
See application file for complete search history.

(56) References Cited

U.S. PATENT DOCUMENTS 12,148,736 B2 * 11/2024 Boo ................. H01L 25/50
2009/0146283 A1 * 6/2009 Chen ................ H01L 25/0657
257/E25.01

(Continued)

FOREIGN PATENT DOCUMENTS

CN 111052371 A 4/2020
DE 102019109690 A1 6/2020

OTHER PUBLICATIONS

Chinese Office Action received in CN App No. 202210960752.7 dated Oct. 1, 2025, pp all.

*Primary Examiner* — Timor Karimy
(74) *Attorney, Agent, or Firm* — Dorsey & Whitney LLP (57) ABSTRACT

Stacked semiconductor devices and associated systems and methods are disclosed herein. In some embodiments, the semiconductor device can include a package substrate and a stack of semiconductor dies carried by the package substrate. The stack of semiconductor dies includes a first die carried by the package substrate and a second die carried by the first die. The semiconductor device also includes an interconnect module carried by the package substrate adjacent the stack of semiconductor dies. The interconnect module includes a first end coupled the package substrate, a second end opposite the first end, a conductive via extending through a body of organic material from the first end to the second end. The first semiconductor die can is electrically coupled directly to the package substrate, while the second semiconductor die is electrically coupled to the package substrate through the second end of the interconnect module.

17 Claims, 7 Drawing Sheets

(52) U.S. Cl.
CPC .............. *H01L 2225/06524* (2013.01); *H01L 2225/06562* (2013.01)

(56) References Cited

U.S. PATENT DOCUMENTS

| | | | |
|---|---|---|---|
| 2015/0054169 A1* | 2/2015 | Lee | H01L 24/49 257/773 |
| 2015/0179570 A1* | 6/2015 | Marimuthu | H01L 24/97 438/126 |
| 2019/0067205 A1* | 2/2019 | Rae | H01L 24/81 |
| 2019/0103357 A1 | 4/2019 | Lim et al. | |
| 2019/0139934 A1 | 5/2019 | Ng et al. | |
| 2020/0075548 A1* | 3/2020 | Kim | H01L 24/16 |
| 2020/0126919 A1 | 4/2020 | Kang | |

\* cited by examiner

CONDUCTIVE ORGANIC MODULE FOR SEMICONDUCTOR DEVICES AND ASSOCIATED SYSTEMS AND METHODS

CROSS-REFERENCE TO RELATED APPLICATION(S)

The present application claims priority to U.S. Provisional Patent Application No. 63/238,096, filed Aug. 27, 2021, the disclosure of which is incorporated herein by reference in its entirety.

TECHNICAL FIELD

The present disclosure is generally related to systems and methods for stacked semiconductor devices. In particular, the present technology relates to stacked semiconductor devices having organic modules for coupling dies in stacked semiconductor devices.

BACKGROUND

Microelectronic devices, such as memory devices, microprocessors, and other electronics, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies and yet increase the capacity and/or speed of the resulting semiconductor assemblies. To meet these demands, semiconductor die manufacturers often stack multiple semiconductor dies vertically on top of each other to increase the capacity and/or the performance of a microelectronic device within the limited area on a circuit board or other element to which the semiconductor dies and/or assemblies are mounted. The stacked dies are then electrically coupled to the circuit board and can send and receive signals individually or in conjunction. However, as the height of die stacks increase to meet demands the increasing height presents continual challenges to the electrical connection of the dies.

The drawings have not necessarily been drawn to scale. Similarly, some components and/or operations can be separated into different blocks or combined into a single block for the purpose of discussion of some of the implementations of the present technology. Moreover, while the technology is amenable to various modifications and alternative forms, specific implementations have been shown by way of example in the drawings and are described in detail below. The intention, however, is not to limit the technology to the particular implementations described.

DETAILED DESCRIPTION

Overview

Semiconductor devices that include features adapted for die stacks, and associated systems and methods, are disclosed herein. One option for electrically connecting stacked semiconductor dies is to laterally offset the dies (e.g., stagger the die stack), and interconnect the dies through a series of wire bonds. Various dies in the stack can then be connected to a package substrate through relatively long wire bonds. However, as the number of dies in a single die stack and performance demands each increase, so do the number of wire bonds required to electrically couple the dies to the package substrate. One result of the increasing number of long wire bonds is the formation of electrical shorts between the wire bonds packed into a given area (commonly referred to as "wire sweep"). To provide room for the additional wire bonds, die stacks can include one or more sub-stacks of dies that are offset in varying directions. One sub-stack of dies can then be electrically coupled to the package support substrate on a first side, while another sub-stack of dies can then be electrically coupled to the package support substrate on a second side.

However, the relatively long wire bonds from the upper sub-stacks can still encounter wire sweep issues. Industry demands to shrink the longitudinal footprints of semiconductor packages can require more wire bonds be packed into a single area, which can exacerbate existing wire sweep concerns. Further, the relatively long wire bonds can face a trade-off between cost and performance because they impose a long travel distance for signals to dies in the upper portions of a die stack. For example, the long travel distance can lead to signal delay and/or desynchronization between upper dies and lower dies. One method for addressing this concern is to use costly materials, such as gold, to form the wire bonds with minimal resistance. However, these materials cannot completely alleviate the signal delay/desynchronization concerns, and the cost of using these materials in a semiconductor device can be prohibitive for larger die stacks.

In some embodiments, a representative semiconductor device (sometimes also referred to as a "semiconductor die assembly" and/or a "semiconductor package") includes a package substrate (sometimes also referred to as "a package support substrate," a "substrate," a circuit board," and/or a "carrier") and a stack of semiconductor dies carried by the package substrate. The stack of semiconductor dies includes at least one first die carried by the package substrate and at least one second die carried by the at least one first die. The semiconductor device can also include an interconnect module carried by the package substrate adjacent the stack of dies. In some embodiments, the first die(s) can then be electrically coupled directly to the package substrate, while the second die(s) is electrically coupled to the package substrate through the interconnect module. For example, the first die(s) can be electrically coupled to the package substrate through one or more first wire bonds and/or the second die(s) can be electrically coupled to the interconnect module through one or more second wire bonds.

In some embodiments, the interconnect module includes a first end physically and electrically coupled to a first bond pad on the package substrate, a second end opposite the first end, and a conductive via extending through a body of organic material from the first end to the second end. The organic material can include a prepreg substrate, such as a partially cured epoxy and/or a partially cured resin, allowing the interconnect module to be manufactured in bulk. The interconnect module can also include a second bond pad at the second end. When the interconnect module is attached to the package substrate, the interconnect module carries the second bond pad at an elevation above the package substrate corresponding to the height of the interconnect module. The second wire bonds connecting the second die(s) to the interconnect module can connect to the second bond pad. Because the second bond pad is at the elevation above the package substrate, the second wire bonds can be much shorter than wire bonds directly between the second die(s) and the package substrate. The shorter wire bonds are less likely to form shorts therebetween, thereby reducing concerns about wire sweep.

In addition, because the interconnect module can be formed primarily (or entirely) from organic materials and manufactured in bulk, the module can be relatively cheap to manufacture and implement into a semiconductor device. The interconnect module can also reduce signal delay, signal cross talk, and improve synchronization between the first and second dies. For example, the interconnect module provides a straight path between the package substrate and an elevated bond pad (e.g., as opposed to an arcing path of a wire bond), the interconnect module can shorten the signal travel distance between the package substrate and a relevant die. Further, in some embodiments, the interconnect module includes multiple conductive vias and multiple elevated bond pads. In such embodiments, the organic material at least partially electrically insulates the conductive vias from each other, thereby reducing crosstalk between the vias as compared to adjacent long wire bonds.

For ease of reference, semiconductor devices and their components are sometimes described herein with reference to top and bottom, upper and lower, upwards and downwards, and/or horizontal plane, x-y plane, vertical, or z-direction relative to the spatial orientation of the embodiments shown in the figures. It is to be understood, however, that the semiconductor devices and their components can be moved to, and used in, different spatial orientations without changing the structure and/or function of the disclosed embodiments of the present technology.

Further, although primarily discussed herein in the context of large die stacks, one of skill in the art will understand that the scope of the invention is not so limited. For example, the organic module can also be used in various other aspects of a semiconductor device and/or for any sized stack of semiconductor dies (including a stack of only a single die carried by a package substrate). Accordingly, the scope of the invention is not confined to any subset of embodiments and is confined only by the limitations set out in the appended claims.

DESCRIPTION OF THE FIGURES

Figure 1A:
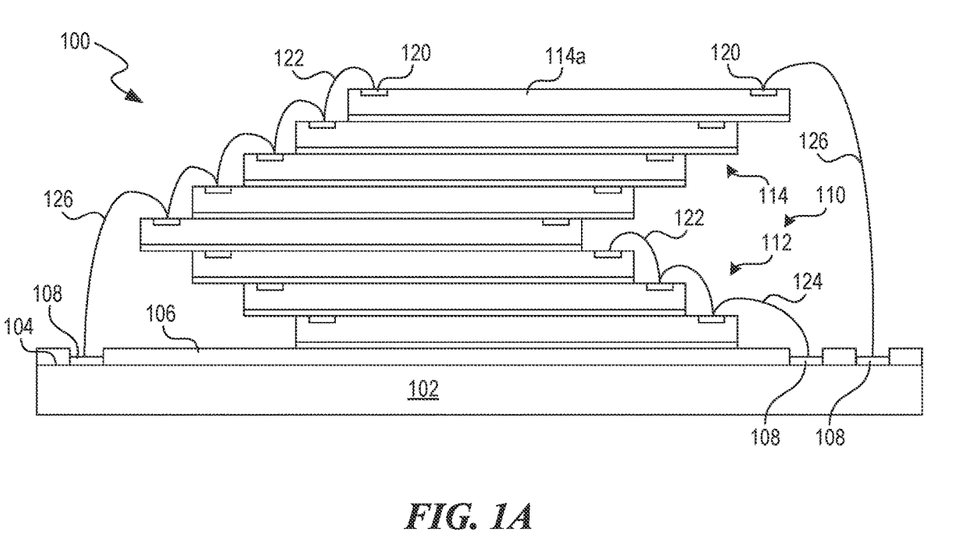
FIGS. 1A and 1B are a cross-sectional side view and a top view, respectively, of a semiconductor device in accordance with some embodiments of the present technology.
Figure 1B:
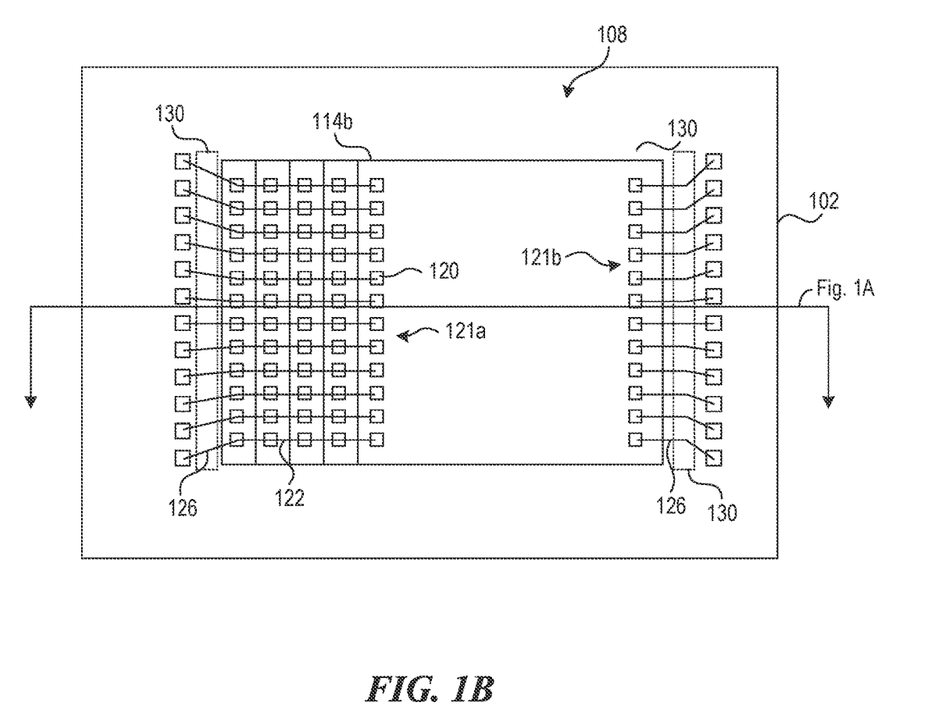

FIGS. 1A and 1B are a cross-sectional side view and a top view, respectively, of a semiconductor device 100 in accordance with some embodiments of the present technology. As illustrated in FIG. 1A, the semiconductor device 100 includes a package substrate 102 and a stack of semiconductor dies 110 (also referred to as the "die stack 110"). In the illustrated embodiment, the package substrate 102 includes a surface 104 (e.g., the upper surface) having a mounting region and an electrical attachment region. The substrate 102 can be a printed circuit board (PCB), a silicon substrate, and/or any other suitable semiconductor material. The surface 104 carries an insulating material 106 and one or more bond pads 108 (two shown in FIG. 1A, many shown in FIG. 1B) exposed through the insulating material 106. In some embodiments, the insulating material 106 can be a dielectric or other suitable material. Further, in various embodiments, the package substrate 102 does not include an insulating material 106, the bond pads 108 can be level with the insulating material 106, the bond pads 108 can be level with the surface 104, and/or the bond pads 108 can be carried by the insulating material 106.

As further illustrated in FIG. 1A, the die stack 110 includes a first sub-stack of dies 112 ("first sub-stack 112") carried by the package substrate 102, and a second sub-stack of dies 114 ("second sub-stack 114") carried by the first sub-stack of dies 112. In the illustrated embodiment, the first sub-stack 112 includes three dies laterally offset in a first direction, while the second sub-stack 114 includes five dies laterally offset in a second direction. Further, each die in the die stack 110 includes one or more bond pads 120 allowing the dies to be interconnected and/or connected to the package substrate 102. For example, each die in the first sub-stack 112 is electrically connected by short wire bonds 122, and electrically connected to at least one of the bond pads 108 by a medium wire bond 124. Similarly, each die in the second sub-stack 114 is electrically connected by short wire bonds 122, and electrically connected to at least one of the bond pads 108 by a long wire bond 126. Further, an uppermost die 114a in the second sub-stack 114 can be directly electrically connected to at least one of the bond pads 108 by a long wire bond 126.

In some embodiments, each of the dies in the die stack 110 can be a memory die, a logic die, a controller die, or any other kind of die. Further, in some embodiments, the die stack 110 can include any combination of die types therein. Purely by way of example, each of the dies in the first sub-stack 112 can be logic dies while each of the dies in the second sub-stack 114 can be memory dies. Additionally, in some embodiments, the die stack 110 can be carried by a controller die (not shown) between the die stack 110 and the substrate 102 and independently connected to the substrate 102 and/or any of the dies in the die stack 110.

As illustrated in FIG. 1B, the one or more bond pads 108 can be a plurality of bond pads 108 carried by the package substrate 102. Further, each of the dies can include a plurality of bond pads 120, each electrically connected to at least one of the bond pads 108 through the series of short, medium, and/or long wire bonds 122, 124, 126 as discussed above. For example, a first array 121a of bond pads 120 on the uppermost die 114a is electrically connected to lower dies by short wire bonds 122, then to the bond pads 108 by long wire bonds 126; while a second array 121b of bond pads 120 on the uppermost die 114a is electrically connected to the bond pads 108 by long wire bonds 126. However, the plurality of long wire bonds 126 can be prone to wire sweep concerns, damage, and/or other problems in the bridging regions 130. Further, the long wire bonds 126 require a significant amount of highly conductive, costly material (e.g., gold wires) to avoid concerns with signal delay due to the long bond lines.

Figure 2:
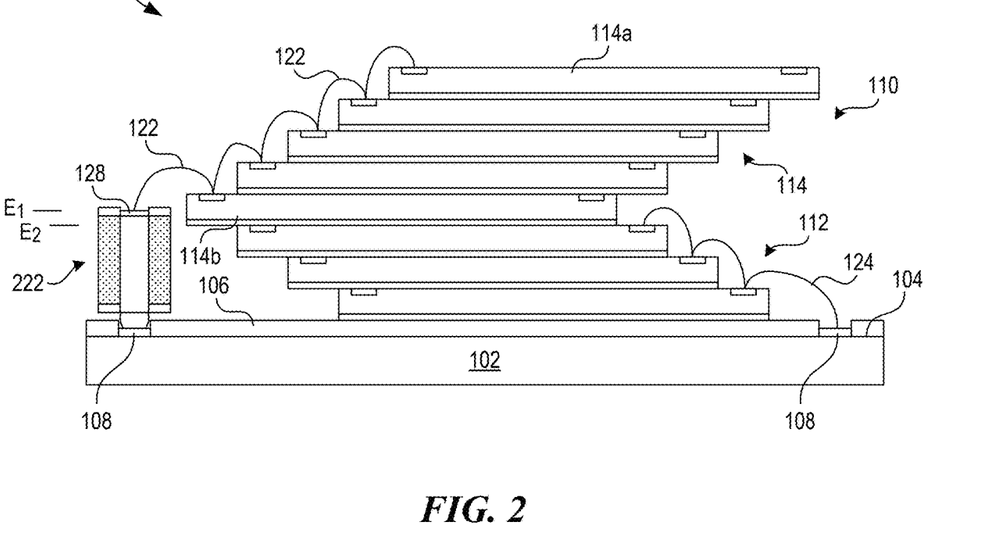
FIG. 2 is a cross-sectional view of a semiconductor device in accordance with some embodiments of the present technology.

FIG. 2 is a cross-sectional view of a semiconductor device 200 in accordance with some embodiments of the present technology. As illustrated, the semiconductor device 200 is generally similar to the semiconductor device 100 described above with respect to FIG. 1A. For example, the semiconductor device 200 includes the package substrate 102 with the surface 104, as well as, the insulating material 106, the bond pads 108, and the die stack 110 all carried by the surface 104 of the package substrate 102. Further, the die stack 110 includes the first sub-stack 112 and the second sub-stack, with each die in the first sub-stack 112 connected to at least one of the bond pads 108 through the series of short and medium wire bonds 122, 124.

However, in the illustrated embodiment, the second sub-stack 114 is connected to at least one of the bond pads 108 through a vertical interconnect module 222 (the "interconnect module 222"). In the illustrated embodiment, the interconnect module 222 is physically carried by and electrically coupled to at least one of the bond pads 108 and includes at least one bond pad 228 at a first elevation $E_1$ above the surface 104 of the package substrate 102 that is electrically coupled to the at least one bond pad 108 (sometimes also referred to as a "bond site"). Accordingly, the interconnect module 222 provides the bond pad 228 at the first elevation $E_1$ to electrically connect the second sub-stack 114 to the package substrate 102. For example, as illustrated in FIG. 2, each of the dies in the second sub-stack 114 can be interconnected through short wire bonds 122. Further, the second sub-stack 114 includes a lowermost die 114b (also referred to as an "intermediary die" between the first sub-stack 112 and the second sub-stack 114) that is carried by the first sub-stack at a second elevation $E_2$ above the package substrate 102. In the illustrated embodiment, the first elevation $E_1$ is above the second elevation $E_2$. Accordingly, the lowermost die 114b can be connected to the bond pad 228 by another short wire bond 122, but is laterally offset from the interconnect module to provide sufficient room for the interconnect module 222 to be disposed adjacent the die stack 110 (e.g., disposed near a perimeter footprint of the bottom die in the die stack 110; near an outermost edge of the bottom die in the die stack 110; near a perimeter footprint of the lowermost die 114a; near an outermost edge of the lowermost die 114a; near a perimeter footprint of the whole die stack 110; near enough a bond pad 120 (FIG. 1B) of lowermost die 114b that the short wire bond 122 reaching the interconnect module 222 is of a similar length as those interconnecting second sub-stack 114 (i.e., about the same, more than half the distance, more than a quart of the distance, less than 2× the distance, less than 3× distance, and the like); within a predetermined distance of the die stack 110; and the like).

In various embodiments, the first elevation $E_1$ can be below the second elevation $E_2$, above the second elevation $E_2$, and/or generally coplanar with the second elevation $E_2$, any of which can then require another short wire bond 122 and/or a medium wire bond 124 to electrically couple the lowermost die 114b to the interconnect module 222. In some embodiments, as discussed in more detail below, the semiconductor device 200 can include multiple interconnect modules. In some such embodiments, the interconnect modules can have varying heights. For example, a first interconnect module can carry one or more bond pads at, below, or just above the elevation of the lowermost die in the second sub-stack; and a second module can carry one or more bond pads at, below, or just above the elevation of the uppermost die in the second sub-stack.

Figure 3:
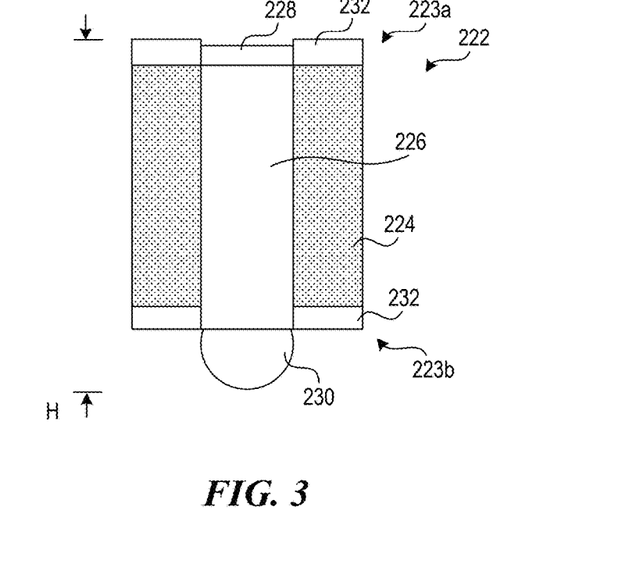
FIG. 3 is a cross-sectional view illustrating additional details of an organic interconnect module that can be used in a semiconductor device in accordance with some embodiments of the present technology.

FIG. 3 is a cross-sectional view illustrating additional details of an interconnect module 222 in accordance with some embodiments of the present technology. In the illustrated embodiment, the interconnect module 222 includes a first end 223a and a second end 223b, a body of organic material 224 (the "body 224"), and a conductive via 226 extending through the body 224 from the first end 223a to the second end 223b. In various embodiments, the body 224 includes a prepreg substrate, such as a partially cured epoxy or resin (e.g., naphthalene-based resins, dicyclopentadiene-based resins, and the like), other coreless substrates, and/or another suitable organic material. Accordingly, in some embodiments, the interconnect module 222 can be manufactured in a large wafer or a board, then diced according to desired dimensions for the interconnect module 222. The relatively cheap organic material and potential to manufacture in bulk can further improve the cost reductions realized by replacing the long wire bonds 126 (FIG. 1A) with the interconnect module 222. In various embodiments, the conductive via 226 includes a conductive metal (e.g., copper, gold, silver, tin, and/or any other suitable metal or alloy) and/or any other suitable conductive material. In some embodiments, the body 224 can be a silicon substrate while the conductive via 226 is a through substrate via formed in the silicon substrate.

As further illustrated in FIG. 3, the bond pad 228 is coupled to the conductive via 226 at the first end 223a and a bonding structure 230 is coupled to the conductive via 226 at the second end 223a. The bond pad 228 can increase the durability of an electrical connection to the interconnect module without imposing a significant manufacturing cost to do so. In some embodiments, the bond pad 228 can include a layer of gold or other suitable bonding material to establish electrical connections to the short and/or medium wire bonds 122, 124 (e.g., FIG. 2). Similarly, the bonding structure 230 can increase the ease of electrically coupling and/or attaching the interconnect module 222 to the package substrate 102. For example, in various embodiments, the bonding structure 230 includes a solder structure (e.g., a solder ball), a metal suitable for a metal-metal bond, and/or any other suitable material. In a specific example, the interconnect module 222 can be attached to the package substrate 102 by aligning the interconnect module 222 with one or more bond pads 108 (FIG. 2) and reflowing solder in the bonding structure 230 to form a physical and electrical connection to the bond pad(s) 108.

In the embodiment illustrated in FIG. 3, each of the first and second ends 223a, 223b of the interconnect module 222 include an insulation layer 232 that at least partially expose the bond pad 228 and the conductive via 226. The insulation layers 232 can protection the interconnect module 222 during the manufacturing process, for example while reflowing solder in the bonding structure 230 or connecting wire bonds to the bond pad 228. In various embodiments, the insulation layers 232 can be a dielectric material and/or any other suitable material. In various embodiments, the interconnect module 222 includes only one, or neither, of the insulation layers 232.

As further illustrated in FIG. 3, the interconnect module 222 has a height H from a base 231 of the bonding structure 230 to the surface 229 of the bond pad 228. The height H generally corresponds to the elevation of the bond pad 228 after the interconnect module 222 is attached to the package substrate 102. Accordingly, in some embodiments, the height H can be varied according to desired specifications for the interconnect module 222. For example, a first interconnect module can have a first height to elevate the bond pad 228 to the elevation of the lowermost die 114b (FIG. 2) while a second interconnect module can have a second height to elevate the bond pad 228 to the elevation of the uppermost die 114a (FIG. 2), as discussed in more detail below.

Figure 4A:
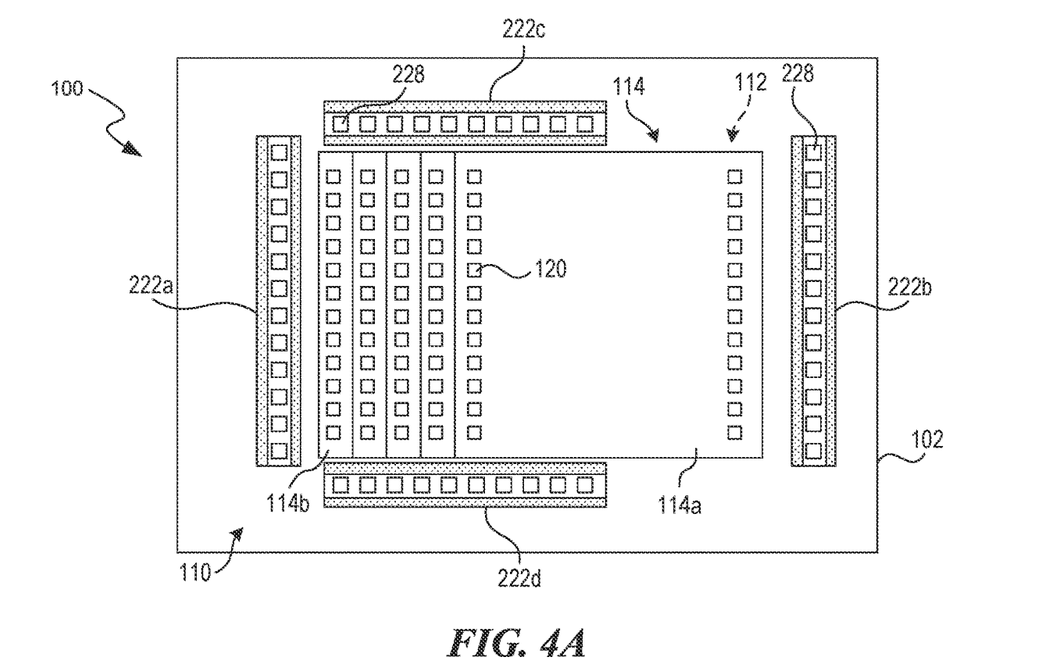
FIGS. 4A-4C are top views of a semiconductor device at various stages of manufacturing in accordance with some embodiments of the present technology.

FIG. 4A is a top view of a semiconductor device 200 of the type illustrated in FIG. 2 in accordance with some embodiments of the present technology. In the illustrated embodiment, the semiconductor device 200 includes four interconnect modules 222 (referred to individually as "first-fourth interconnect modules 222a-222d"). Each of the first-fourth interconnect modules 222a-222d can have an independent height and/or can have a height equivalent to another module. For example, the first interconnect module 222a can have a first height, the second interconnect module 222b can have a second height, and the third and fourth interconnect modules 222c, 222d can have a third height. In some embodiments, the first height is configured to reduce the distance between the bond pads 120 on the lowermost die 114b and the bond pads 228a. For example, the first height can raise the bond pads 228a to an elevation generally in plane with the lowermost die 114b, beneath the lowermost die 114b, and/or above the lowermost die 114b (e.g., the elevation $E_1$ in FIG. 2). Similarly, the second height is configured to reduce the distance between a portion of the bond pads 120 on the uppermost die 114a and the bond pads 228b-d. For example, the second height can raise the bond pads 228b to an elevation in plane with the uppermost die 114a, beneath the uppermost die 114a, and/or above the uppermost die 114a. Further, the third height can be configured to reduce the distance between the bond pads 228c, 228d and another sub-stack of dies (e.g., see FIG. 4C below) and/or any of the bond pads 120 in the first and second sub-stacks 112, 114.

As described below, the interconnect modules 222 and the die stack 110 can be attached and electrically coupled to the package substrate 102 in any suitable order. For example, in some embodiments, the interconnect modules 222 are attached and electrically coupled to the package substrate 102 after attaching and electrically coupling the first sub-stack 112 to the package substrate 102. In such embodiments, the second sub-stack 114 is then attached to the first sub-stack 112 and electrically coupled to the interconnect modules 222.

Figure 4B:
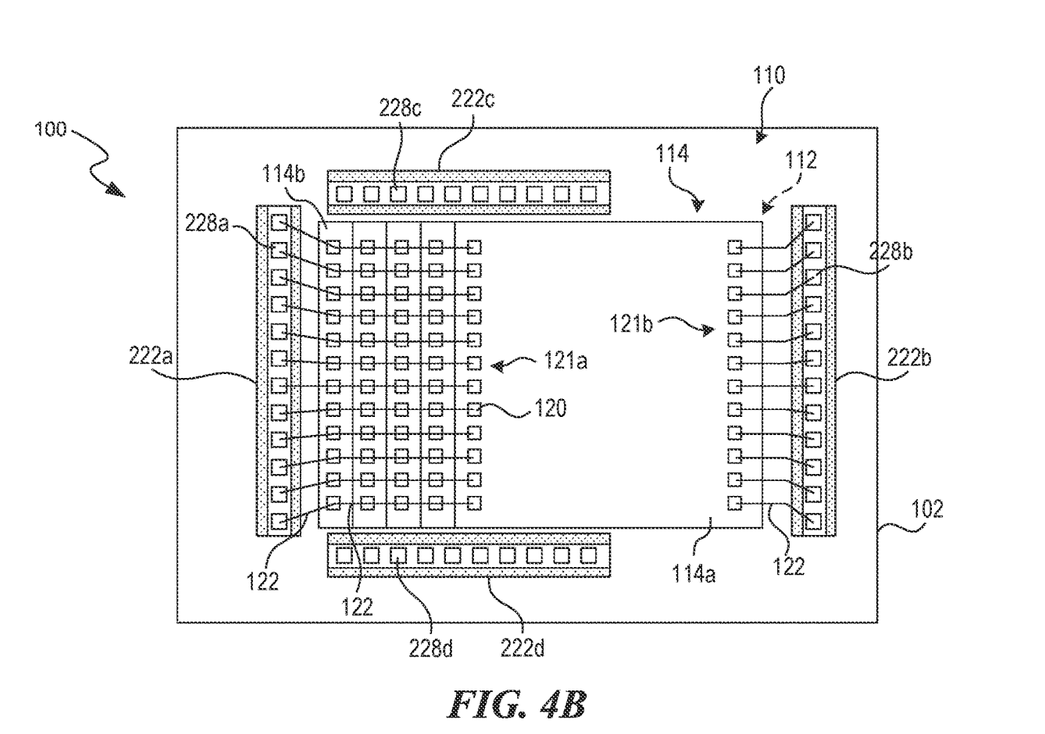

FIG. 4B is a top view of the semiconductor device 200 of the FIG. 4A after electrically coupling the second sub-stack 114 to the interconnect modules 222 in accordance with some embodiments of the present technology. As illustrated in FIG. 4B, each of the dies in the second sub-stack 114 can be electrically coupled to the interconnect modules 222 through short wire bonds 122. For example, a first array 121a of the bond pads 120 on the uppermost die 114a are electrically coupled to the first interconnect module 222a through a series of short wire bonds 122 to lower dies and short wire bonds 122 between the lowermost die 114b and the first interconnect module 222a. Meanwhile a second array 121b of the bond pads 120 on the uppermost die 114a are electrically coupled to the second interconnect module 222b directly through short wire bonds 122. As a result of the bond length of the wire bonds, the semiconductor device 200 can have fewer issues with wire sweep, broken bond lines, signal crosstalk, and/or signal delay.

Figure 4C:
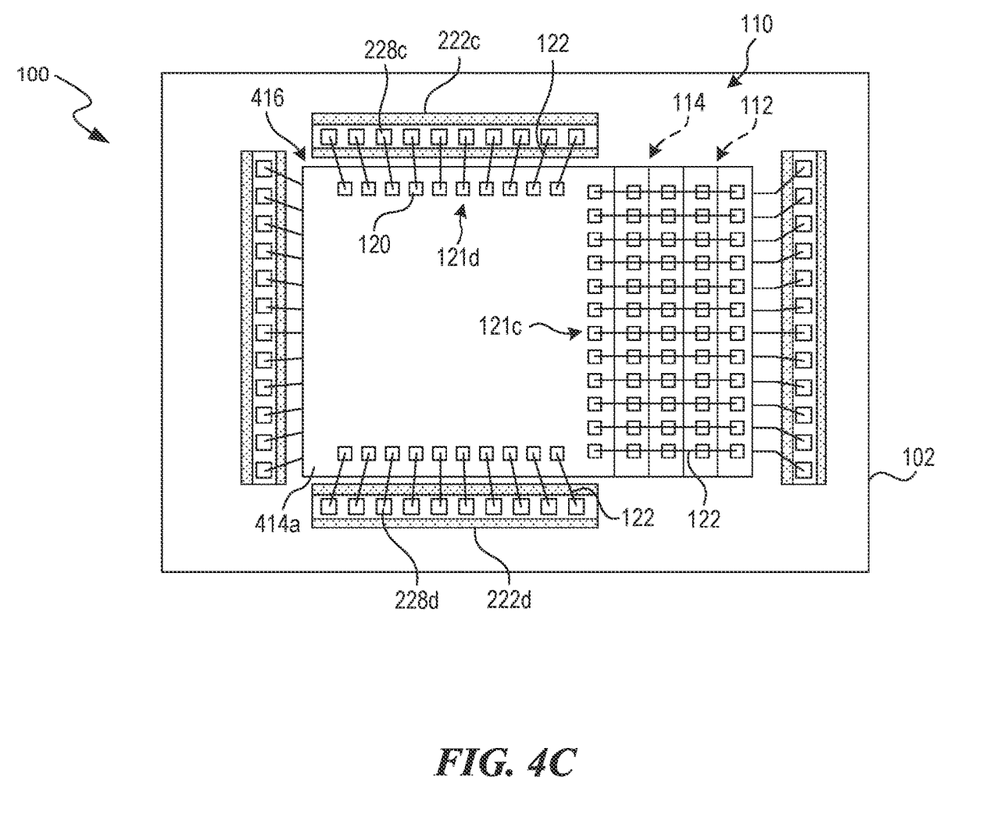

FIG. 4C is a top view of the semiconductor device 200 of the FIG. 4B after stacking a third sub-stack 416 of semiconductor dies on the second sub-stack 114 and electrically coupling the third sub-stack 416 to the third and fourth interconnect modules 222c, 222d in accordance with some embodiments of the present technology. In the illustrated embodiment, each die in the third sub-stack 416 is laterally offset (e.g., staggered) in the opposite direction from the lateral offset of the dies in the second sub-stack 114. Further, as illustrated, each of the each of the dies in the third sub-stack 416 can be electrically coupled to an uppermost die 414a. For example, as illustrated, a first array 121c of the bond pads 120 on the uppermost die 414a are electrically coupled to the lower dies in the third sub-stack 416 through a series of short wire bonds 122. Meanwhile, the interconnect modules 222c, 222d can elevate their respective bond pads 228c, 228d to an elevation at, or near, the elevation of the uppermost die 414a. Accordingly, the uppermost die 414a can be electrically coupled to the bond pads 228c, 228d on the third and fourth interconnect modules 222c, 222d through relatively short connection lines. For example, in the illustrated embodiment, a fourth array 121d of the bond pads 120 on the uppermost die 414a is electrically coupled to the third interconnect module 222c through short wire bonds 122.

Figure 5:
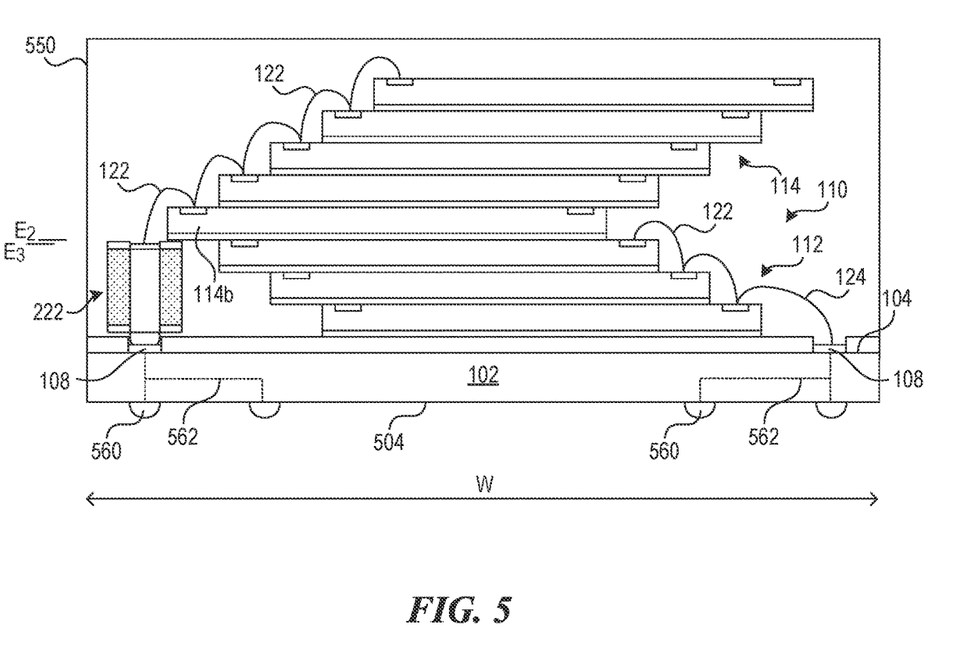
FIG. 5 is a cross-sectional view of a semiconductor device in accordance with further embodiments of the present technology.

FIG. 5 is a cross-sectional view of a semiconductor device 300 in accordance with further embodiments of the present technology. As illustrated, the semiconductor device 300 is generally similar to the semiconductor device 200 of FIG. 2. For example, the semiconductor device 300 includes the package substrate 102, as well as the bond pads 108 and the die stack 110 each carried by the surface 104 of the package substrate 102. Further, the die stack 110 includes the first sub-stack 112 and the second sub-stack 114. Each die in the first sub-stack 112 is connected to at least one of the bond pads 108 through the series of short and medium wire bonds 122, 124; while each die in the second sub-stack 114 is connected to at least one of the bond pads 108 through short wire bonds 122 and the interconnect module 222.

However, in the illustrated embodiment, the interconnect module 222 carries the bond pads 128 at a third elevation $E_3$ beneath the second elevation $E_2$ of the lowermost die 114b. As a result, the interconnect module 222 can be positioned at least partially underneath the lowermost die 114b (e.g., at least partially within a perimeter defined by an outermost edge of the lowermost die 114b), thereby allowing the width W of the semiconductor device 300 to be reduced without escalating wire sweep concerns. In some embodiments, the third elevation $E_3$ can be the same as the second elevation $E_2$, thereby allowing the lowermost die 114b to be at least partially carried by and/or supported by the interconnect module 222.

As further illustrated in FIG. 5, the semiconductor device 300 can include an encapsulant 550 that at least partially covers the components of the semiconductor device 300. In the illustrated embodiment, the encapsulant 550 completely covers the die stack 110 and the interconnect module 222. In some embodiments, one or more components (e.g., one or more dies, one or more bond pads 108, and/or the interconnect module 222) are at least partially exposed after the encapsulant 550 is formed on the semiconductor device 300. In various embodiments, the encapsulant can be an epoxy resin that is fully cured on the semiconductor device 300.

As further illustrated in FIG. 5, the semiconductor device 300 can also include bonding structures 560 (four illustrated, two labeled) on a lower surface 504 of the package substrate 102. The bonding structures 560 can facilitate electrical, thermal, and/or physical connection to other features in a semiconductor assembly. For example, as discussed below, the bonding structures 560 can facilitate electrically coupling the semiconductor device 300 to a printed circuit board assembly into a memory of an electronics assembly. The bonding structures 560 can include a bond pad, a solder structure (e.g., a solder ball), a metal layer for metal-metal bonding, and/or any other suitable element for interconnecting the semiconductor device 300 to other features in a semiconductor assembly. Further, in the illustrated embodiment, the bonding structures 560 are electrically coupled to the bond pads 108 on the surface 104 of the substrate 102 by internal electronic connections 562 (e.g., through substrate vias, redistribution layers, and the like). The internal electronic connections 562 allow the components of the semiconductor device 300 to be fully encased by the encapsulant 550 and still be connected to external electronics in the semiconductor assembly.

Although the encapsulant 550, bonding structures 560, and internal electronic connections 562 were discussed above with respect to the embodiments of FIG. 5, one of skill in the art will understand that any of the embodiments of FIGS. 1A-4C can also include these features. For example, the semiconductor device 200 of FIG. 2 can also include the encapsulant 550, bonding structures 560, and internal electronic connections 562 in a similar (or the same) construction as discussed above with respect to FIG. 5.

Further, although discussed above in the context of reducing the distance from the uppermost and lowermost dies in the second sub-stack to an electrical connection with the substrate, one of skill in the art will understand that the application of the interconnect module is not so limited. That is, the semiconductor device can include an interconnect module with a height configured to provide an electrical connection to the substrate to any die in the die stack. For example, in some embodiments, the lowermost die in the first sub-stack is electrically coupled to the substrate through a relatively short interconnect module, while the lowermost die in the second sub-stack is electrically coupled to the substrate through another interconnect module.

Further, as discussed above, the die stack can include additional sub-stacks carried by the second sub-stack. In some such embodiment, each of the additional sub-stacks can be electrically coupled to the package substrate through one or more additional interconnect modules. In some embodiments, all of the additional interconnect modules have the same height, allowing the interconnect modules to be manufactured in bulk. In some embodiments, each of the additional interconnect modules has an independent height configured according to the elevation of the corresponding sub-stack. For example, interconnect modules for the third sub-stack can have a larger height than interconnect modules for the second sub-stack.

In some embodiments, one or more of the additional sub-stacks can be electrically coupled to the package substrate through a single additional interconnect modules. For example, any two or more of the first, second, third, fourth, etc. sub-stacks can be electrically coupled to the substrate through a single interconnect module. In some such embodiments, one or more of the sub-stacks are electrically coupled to corresponding independent bond pads carried by the interconnect module. For example, the second sub-stack can be electrically coupled to a first bond pad while the third sub-stack is electrically coupled to a second bond pad. In some embodiments, one or more of the sub-stacks are electrically coupled to the same bond pads. For example, each of the second and third sub-stacks can be connected to a first bond pad while the fourth sub-stack is connected to a second bond pad.

Figure 6:
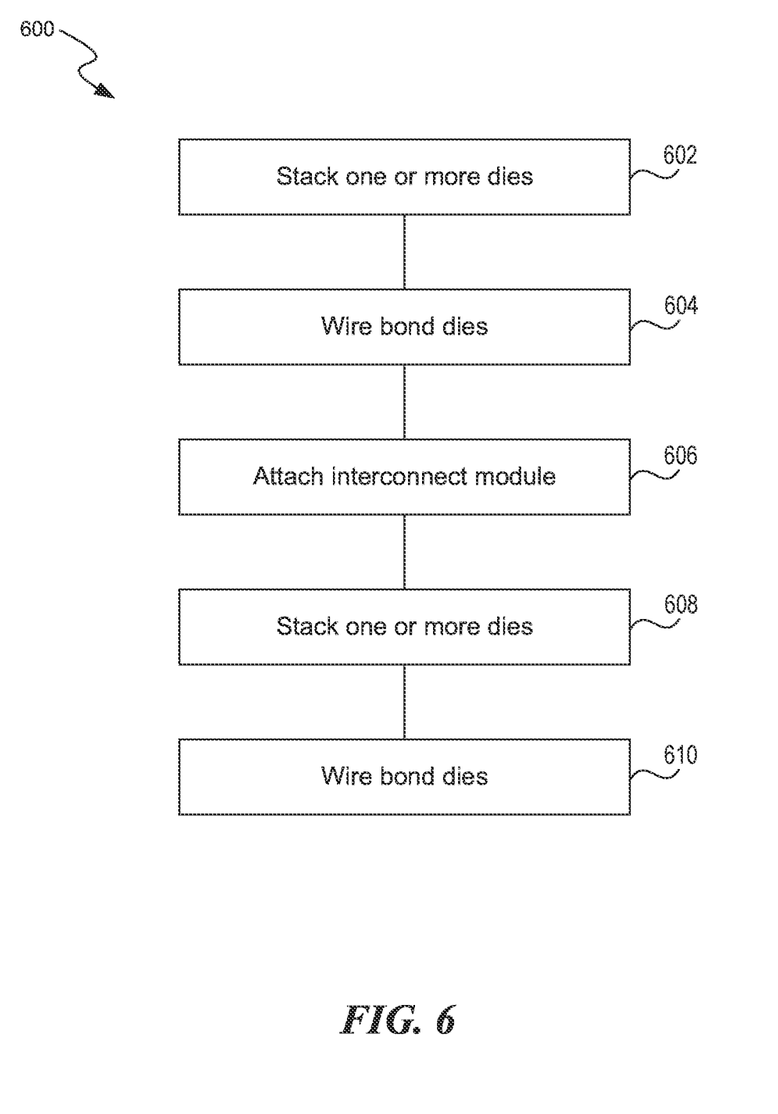
FIG. 6 is a block diagram of a process for manufacturing a semiconductor device in accordance with some embodiments of the present technology.

FIG. 6 is a block diagram of a process 600 for manufacturing a semiconductor device of the type illustrated in FIG. 2 in accordance with some embodiments of the present technology. In the illustrated embodiment, the process 600 begins at block 602 with stacking one or more first dies on a package substrate. The one or more first dies can include a portion of a first sub-stack, the entirety of the first sub-stack, at least a portion of additional sub-stacks, and/or every die that will be included in a relevant die stack.

At block 604, the process 600 includes forming wire bond connections. In some embodiments, the wire bond connections formed at block 604 electrically intercouple each of the one or more first dies. Additionally, or alternatively, the wire bond connections can electrically couple the one or more first dies to the package substrate.

At block 606, the process 600 includes attaching one or more interconnect modules to the package substrate. Attaching the interconnect modules can form a physical and/or an electrical connection between the interconnect modules and the package substrate. In some embodiments, attaching the interconnect modules to the package substrate includes a reflow process between a conductive structure on the interconnect module and a bond pad on the substrate. In some embodiments, attaching the interconnect modules to the package substrate includes a metal-metal bonding process (e.g., heating and applying pressure between a metal on the interconnect module and a metal on the package substrate).

Further, in some embodiments, the process can execute block 606 before executing block 604 to wire bond the first dies after the interconnect module is attached to the substrate. For example, in embodiments in which even the lowermost die in the first sub-stack is electrically coupled to the package substrate through a short interconnect module, the wire bond connections cannot be formed until after the interconnect module is attached to the package substrate.

In some embodiments, the process 600 returns to block 604 after block 606 to form additional wire bond connections. For example, in some embodiments, the process 600 forms a first set of wire bond connections (e.g., wire bonds between each of the one or more stacked dies) at block 604, attaches the interconnect modules at block 606, then forms a second set of wire bond connections (e.g., wire bonds between one or more upper stacked dies and the interconnect module) at a repeated block 604. In some embodiments, the second set of wire bond connections is formed at optional block 610, discussed below.

At optional block 608, the process 600 includes stacking one or more second dies on the first dies from block 602. In various embodiments, the one or more second dies can include an additional portion of the first sub-stack, a portion of the second sub-stack, the entirety of the second sub-stack, at least a portion of additional sub-stacks, and/or every additional die that will be included in a relevant die stack (e.g., dies in second-fourth stacks). In various embodiments, the process 600 can execute optional block 608 before executing block 606 or before executing block 604. For example, in some embodiments, the process 600 stacks the first dies on the package substrate at block 602, forms wire bond connections at block 604, then stacks the second dies on the first dies at optional block 608 before attaching the interconnect modules to the package substrate at block 606.

At optional block 610, the process 600 includes forming additional wire bond connections. In various embodiments, the additional wire bond connections can electrically intercouple the second dies, electrically couple the second dies to the package substrate, electrically intercouple one or more of the first and second dies, further electrically the first dies, and/or electrically couple the first dies to the package substrate. For example, in some embodiments, the additional wire bond connections can electrically intercouple the dies in a second sub-stack of dies as well as electrically couple the second sub-stack to the interconnect module.

In some embodiments, the process does not include optional block 608 and/or optional block 610. For example, in embodiments in which the entirety of the dies are stacked on the package substrate in block 602, the process 600 does not include optional block 608. In another example, in some embodiments in which the process attaches the interconnect modules at block 606 before forming any wire bonds, the process 600 does not include optional block 610 because all of the wire bonds can be formed at block 604.

Further, as discussed above, one or more of the blocks 602-610 can be performed in another order than illustrated and/or omitted altogether. For example, as discussed above, the process 600 can execute block 604 after block 606 to wire bond the dies after the interconnect module is attached to the substrate; can execute block 606 after optional block 608 to attach the interconnect module after completing the die stack; etc. Further, as discussed above, the process 600 can omit some of the blocks discussed above (e.g., the process 600 can omit any of the optional blocks 608, 610).

Figure 7:
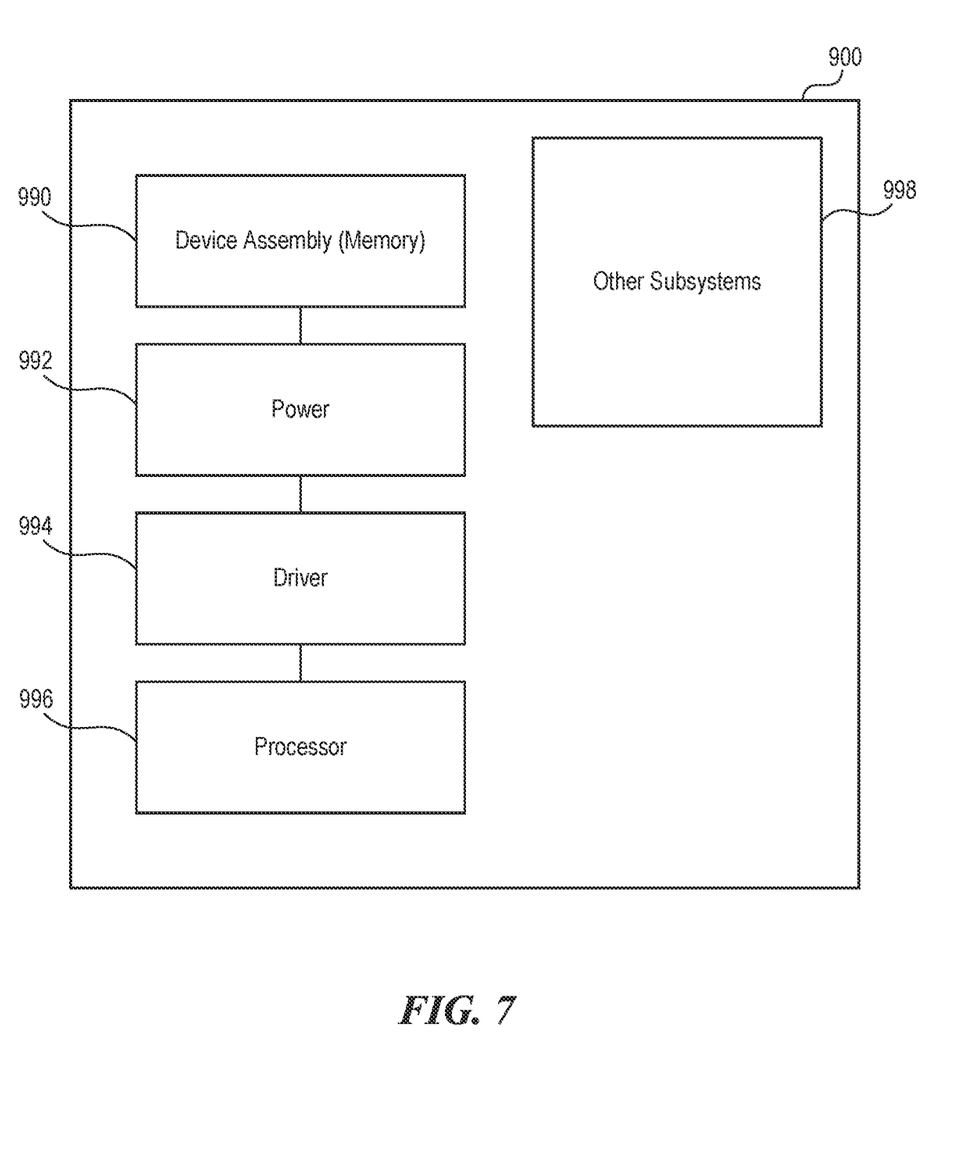
FIG. 7 is schematic view of a system that includes a semiconductor die assembly configured in accordance with embodiments of the present technology.

FIG. 7 is a schematic view of a system 900 that includes a semiconductor die assembly configured in accordance with embodiments of the present technology. Any one of the semiconductor devices having the features and/or resulting from the processes described above with reference to FIGS. 1A-6 can be incorporated into any of a myriad of larger and/or more complex systems, a representative example of which is system 900 shown schematically in FIG. 7. The system 900 can include a memory 990 (e.g., SRAM, DRAM, flash, and/or other memory devices), a power supply 992, a drive 994, a processor 996, and/or other subsystems or components 998. Semiconductor devices like those described above with reference to FIGS. 1A-5B, or resulting from the processes described above with respect to FIG. 6, can be included in any of the elements shown in FIG. 7. For example, the memory 990 can include a stacked semiconductor device with an organic module such as those described above with respect to FIG. 3. The resulting system 900 can be configured to perform any of a wide variety of suitable computing, processing, storage, sensing, imaging, and/or other functions. Accordingly, representative examples of the system 900 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 900 include lights, cameras, vehicles, etc. With regard to these and other example, the system 900 can be housed in a single unit or distributed over multiple interconnected units, e.g., through a communication network. The components of the system 900 can accordingly include local and/or remote memory storage devices and any of a wide variety of suitable computer-readable media.

Conclusion

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

I claim:

1. A semiconductor device, comprising:
a package substrate;
a stack of semiconductor dies carried by the package substrate, the stack of semiconductor dies including a first sub-stack of two or more dies, a second sub-stack of two or more dies carried by the first sub-stack of two or more dies, and a third sub-stack of two or more semiconductor dies carried by the second sub-stack of two or more dies, wherein the second sub-stack of two or more dies includes a lowermost die with a lowermost surface at a first elevation;
a first interconnect module carried by the package substrate adjacent to a first side of the stack of semiconductor dies, the first interconnect module including:
a first end physically and electrically coupled directly to a first bond site on the package substrate,
a second end opposite the first end wherein the second end of the first interconnect module is at a second elevation at or above the first elevation,
a conductive via extending through a body of organic material from the first end to the second end, and
a second bond site at the second end; and
a second interconnect module carried by the package substrate adjacent to a second side of the stack of semiconductor dies,
wherein:
the lowermost die in the second sub-stack of two or more dies is electrically coupled to the package substrate by a wire bond extending from the lowermost die to the second bond site, and the third sub-stack of two or more dies is electrically coupled to the package substrate through the second interconnect module.

2. The semiconductor device of claim 1 wherein the organic material includes a prepreg substrate, and wherein the conductive via extends from the first end through the prepreg substrate to the second bond site at the second end.

3. The semiconductor device of claim 2 wherein the first interconnect module further includes a solder ball physically and electrically coupling the first end directly to the package substrate, and wherein the second bond site at the second end includes an uppermost gold layer.

4. The semiconductor device of claim 1 wherein:
each die in the first sub-stack of two or more dies is staggered in a first direction; and
each die in the second sub-stack of two or more dies is staggered in a second direction different from the first direction.

5. The semiconductor device of claim 1 wherein the wire bond is a first wire bond, and wherein a lowermost die in the first sub-stack is electrically coupled to the package substrate through a second wire bond.

6. A semiconductor device, comprising:
a package substrate having a mounting surface, wherein the mounting surface includes a die attach region and an electrical connection region adjacent the die attach region;
a stack of semiconductor dies carried by the die attach region of the package substrate, the stack of semiconductor dies including a first sub-stack carried by the package substrate and a second sub-stack carried by the first sub-stack, wherein:
the first sub-stack includes a lowermost die attached to the die attach region of the package substrate and an uppermost die above the lowermost die, wherein each die in the first sub-stack is electrically connected to the lowermost die, and wherein the lowermost die is electrically connected to a third bond pad on the package substrate, and
the second sub-stack includes an intermediary die carried by the uppermost die in the first sub-stack, wherein each die in the second sub-stack is electrically connected to the intermediary die; and
an organic conductive module carried by the package substrate and electrically coupled to a first bond pad in the electrical connection region, the organic conductive module having a first end electrically coupled to the first bond pad and a second end opposite the first end, wherein the organic conductive module is positioned at least partially within a footprint of the second sub-stack such that at least a portion of the organic conductive module is positioned beneath the second sub-stack, and wherein the intermediary die in the second sub-stack is electrically coupled to a second bond pad on the second end of the organic conductive module.

7. The semiconductor device of claim 6 wherein the organic conductive module includes a prepreg substrate and a conductive via extending through the prepreg substrate.

8. The semiconductor device of claim 7 wherein the prepreg substrate includes partially cured epoxy or resin.

9. The semiconductor device of claim 7 wherein the conductive via includes a copper interconnect structure.

10. The semiconductor device of claim 6 wherein:
the lowermost die of the first sub-stack is electrically connected to the third bond pad on the package substrate by first wire bonds;
the intermediary die of the second sub-stack is electrically connected to the second bond pad on the organic conductive module by second wire bonds; and
and wherein the first end of the organic conductive module is electrically connected to the first bond pad on the package substrate through a solder connection.

11. The semiconductor device of claim 6 wherein the organic conductive module includes a plurality of bond pads at the second end and a plurality of interconnect structures, each interconnect structure extending from an individual bond site to the first end of the organic conductive module.

12. The semiconductor device of claim 6 each die in the stack of semiconductor dies has a first thickness, wherein the organic conductive module further includes a body of organic material extending from the first end to the second end, and wherein the body of organic material has a second thickness greater than the first thickness.

13. A semiconductor device, comprising:
a package substrate;
a stack of semiconductor dies carried by the package substrate, the stack of semiconductor dies including a first sub-stack of two or more dies and a second sub-stack of two or more dies carried by the first sub-stack of two or more dies, wherein the second sub-stack of two or more dies includes a lowermost die with a lowermost surface at a first elevation, and wherein each semiconductor die in the second sub-stack of two or more dies is electrically coupled to the lowermost die in the second sub-stack of two or more dies by one or more wire bonds; and
an interconnect module carried by the package substrate adjacent the stack of semiconductor dies, the interconnect module including:
a first end physically and electrically coupled directly to a first bond site on the package substrate,
a second end opposite the first end wherein the second end of the interconnect module is at a second elevation at or above the first elevation,
a conductive via extending through a body of organic material from the first end to the second end, and
a second bond site at the second end,
wherein the lowermost die in the second sub-stack of two or more dies is electrically coupled to the package substrate by a wire bond extending from the lowermost die to the second bond site.

14. The semiconductor device of claim 13 wherein the organic material includes a prepreg substrate, and wherein the conductive via extends from the first end through the prepreg substrate to the second bond site at the second end.

15. The semiconductor device of claim 14 wherein the interconnect module further includes a solder ball physically and electrically coupling the first end directly to the package substrate.

16. The semiconductor device of claim 13 wherein the lowermost die in the second sub-stack of two or more dies is a second lowermost die, wherein the first sub-stack of two or more dies includes a first lowermost die, and wherein the first lowermost die, wherein each die in the first sub-stack of two or more dies is electrically connected to the first lowermost die, and wherein the first lowermost die is electrically connected to a third bond site on the package substrate.

17. The semiconductor device of claim 13 wherein:
each die in the first sub-stack of two or more dies is staggered in a first direction; and each die in the second sub-stack of two or more dies is staggered in a second direction different from the first direction.

\* \* \* \* \*